(12) United States Patent
Nakamura et al.

(10) Patent No.: US 8,395,056 B2
(45) Date of Patent: Mar. 12, 2013

(54) MULTILAYER PRINTED WIRING BOARD AND MOUNTING BODY USING THE SAME

(75) Inventors: Tadashi Nakamura, Osaka (JP); Fumio Echigo, Osaka (JP); Masaaki Katsumata, Osaka (JP)

(73) Assignee: Panasonic Corporation, Osaka (JP)

( * ) Notice: Subject to any disclaimer, the term of this patent is extended or adjusted under 35 U.S.C. 154(b) by 213 days.

(21) Appl. No.: 12/811,800

(22) PCT Filed: Jan. 16, 2009

(86) PCT No.: PCT/JP2009/000137
§ 371 (c)(1),
(2), (4) Date: Jul. 6, 2010

(87) PCT Pub. No.: WO2009/090878
PCT Pub. Date: Jul. 23, 2009

(65) Prior Publication Data
US 2010/0276187 A1    Nov. 4, 2010

(30) Foreign Application Priority Data
Jan. 18, 2008   (JP) ................. 2008-008859

(51) Int. Cl.
*H05K 9/00* (2006.01)
(52) U.S. Cl. ........ 174/262; 174/255; 174/260; 174/164; 174/265; 361/746; 361/748; 361/750; 361/760; 361/762; 29/830
(58) Field of Classification Search .......... 174/252–267; 361/735, 736, 746, 748, 750, 762, 771, 784, 361/790–795; 29/825–849; 428/212, 210, 428/308.4, 413, 414, 45, 416, 417, 418, 431, 428/428/480; 525/524, 529, 530, 533
See application file for complete search history.

(56) References Cited

U.S. PATENT DOCUMENTS

| | | | | |
|---|---|---|---|---|
| 5,031,308 A | * | 7/1991 | Yamashita et al. | 29/830 |
| 5,337,466 A | * | 8/1994 | Ishida | 29/830 |
| 5,440,075 A | * | 8/1995 | Kawakita et al. | 174/265 |
| 5,834,848 A | * | 11/1998 | Iwasaki | 257/778 |
| 5,896,650 A | * | 4/1999 | Nishide et al. | 29/830 |
| 6,026,564 A | * | 2/2000 | Wang et al. | 29/830 |
| 7,070,207 B2 | * | 7/2006 | Asai | 285/14 |
| 7,080,446 B2 | * | 7/2006 | Baba et al. | 29/832 |
| 7,226,654 B2 | * | 6/2007 | Kawai et al. | 428/210 |
| 7,488,895 B2 | * | 2/2009 | Hayashi et al. | 174/255 |
| 7,759,582 B2 | * | 7/2010 | Takahashi et al. | 174/264 |
| 7,879,445 B2 | * | 2/2011 | Watanabe et al. | 428/413 |
| 7,973,249 B2 | * | 7/2011 | Takahashi et al. | 174/264 |
| 2001/0052425 A1 | | 12/2001 | Andoh et al. | |
| 2003/0219588 A1 | * | 11/2003 | Ogawa et al. | 428/308.4 |

(Continued)

FOREIGN PATENT DOCUMENTS

| CN | 1336789 A | 2/2002 |
|---|---|---|
| JP | 06335992 A | * 12/1994 |

(Continued)

*Primary Examiner* — Michail V Datskovskiy
(74) *Attorney, Agent, or Firm* — McDermott Will & Emery LLP

(57) ABSTRACT

A multilayer printed wiring board (11) is composed of a plurality of printed wiring boards (21a and 21b) each having wiring on its both sides, and a relaxing connection layer (15) for interconnecting the printed wiring boards (21a and 21b). The relaxing connection layer (15) contains an inorganic filler, a thermosetting resin, and a reliever for relieving internal stress. The multilayer printed wiring board (11) is prevented from warpage by making the relaxing connection layer (15) disposed inside it absorb internal stress caused by heating and cooling in a solder reflow process or other processes.

16 Claims, 12 Drawing Sheets

U.S. PATENT DOCUMENTS

| | | |
|---|---|---|
| 2004/0246688 A1 * | 12/2004 | Pai et al. .................. 361/760 |
| 2006/0012967 A1 | 1/2006 | Asai et al. |
| 2006/0154078 A1 * | 7/2006 | Watanabe et al. ............ 428/413 |
| 2007/0119617 A1 * | 5/2007 | Hayashi et al. ............... 174/260 |
| 2007/0169960 A1 * | 7/2007 | Hayashi ....................... 174/262 |
| 2007/0213499 A1 * | 9/2007 | Uera et al. ................... 528/205 |

FOREIGN PATENT DOCUMENTS

| | | | |
|---|---|---|---|
| JP | 07-297560 | | 11/1995 |
| JP | 408231940 A | * | 9/1996 |
| JP | 2001-036253 A | | 2/2001 |
| JP | 0 2001102758 A | * | 4/2001 |
| JP | 2003-243835 | | 8/2003 |
| JP | 02003298196 A | * | 10/2003 |
| JP | 2004-004428 | | 1/2004 |
| JP | 2007126498 A | * | 5/2007 |
| JP | 2007-165460 | | 6/2007 |
| JP | 2007-335585 A | | 12/2007 |
| JP | 2008222872 A | * | 9/2008 |

* cited by examiner

MULTILAYER PRINTED WIRING BOARD AND MOUNTING BODY USING THE SAME

RELATED APPLICATIONS

This application is the U.S. National Phase under 35 U.S.C. §371 of International Application No. PCT/JP2009/000137, filed on Jan. 16, 2009, which in turn claims the benefit of Japanese Application No. 2008-008859, filed on Jan. 18, 2008, the disclosures of which Applications are incorporated by reference herein.

TECHNICAL FIELD

The present invention relates to a multilayer printed wiring board used in various electronic devices such as personal computers, telephones for mobile communications, and video cameras, and also relates to a mounting body using the wiring board.

BACKGROUND ART

Mobile products such as personal computers, digital cameras, and mobile phones are growing in popularity in recent years, and are desired to become more compact and more functional.

For example, recent mobile phones are required to have the function of taking pictures at a high-definition resolution of 2 million pixels or more.

Patent Document 1 discloses a module with built-in components and a camera module that each include a multilayer circuit board. Such modules, which are used on another circuit board like a motherboard, are expensive, and therefore, it is required to use inexpensive circuit boards.

FIG. 11 is a sectional view of a mounting body in which the camera module of Patent Document 1 including a conventional multilayer circuit board is mounted on a multilayer printed wiring board. In other words, FIG. 11 shows a sectional view of a mounting body for a camera module in which multilayer printed wiring board P2 for the camera module is mounted on multilayer printed wiring board P1. Multilayer printed wiring board P1 can be a laminated body of a glass fiber and an epoxy resin, and can be a motherboard for a mobile phone. Multilayer printed wiring board P2 can be a multilayer printed wiring board of several millimeters square for a camera module. Multilayer printed wiring board P2 may be designed for a module with built-in components.

As shown in FIG. 11, large multilayer printed wiring board P1 and small multilayer printed wiring board P2 are each composed of a plurality of layers of wiring 1 stacked through insulating layers 2. Wiring 1 is interconnected through vias 3. Large multilayer printed wiring board P1 and small multilayer printed wiring board P2 are connected via solder balls (not shown).

On the surface of multilayer printed wiring board P2 for the camera module, there is fixed image pickup device 5 such as a CCD in such a manner as to be surrounded by holder 4. Image pickup device 5 is connected to wiring 1 of multilayer printed wiring board P2 through wires 2a and other devices. On holder 4, there is fixed lens 6 having optical axis 7. As shown by the arrow, light 7a from outside projects a predetermined image on image pickup device 5 through lens 6. Holder 4 supports auto-focusing.

In a mounting body including a multilayer printed wiring board, such as a mounting body for a camera module or for a module with built-in components, however, multilayer printed wiring boards P1 and P2 may be subjected to warpage. The warpage is due, for example, to heating and cooling in a solder reflow process during manufacture, or to temperature changes in the usage environment. FIG. 12 is a sectional view showing the warpage problem of multilayer printed wiring boards P1 and P2. As shown in FIG. 12, multilayer printed wiring boards P1 and P2 tend to have warpage 8 by their difference in material or the coefficient of thermal expansion. Warpage 8 means poor flatness, and includes undulation and distortion. As shown in FIG. 12, warpage 8 may result in peeling 9a at joints between large multilayer printed wiring board P1 and small multilayer printed wiring board P2, for example, at joints in a BGA (Ball Grid Array) package having solder balls. In addition, small multilayer printed wiring board P2 and holder 4 may have gap 9b therebetween, which affects the optical system including lens 6. As a result, optical axis 7 of lens 6 deviates as shown by optical axis 7b, making lens 6 out of focus.

Warpage 8 and peeling 9a may also occur in the case of using a module with built-in components instead of a camera module, causing improper connection of wires or other problems.

As described above, the conventional multilayer printed wiring board and the mounting body for a camera module using the board have problems such as optical axis deviation and improper connection due to the warpage and twist of the multilayer printed wiring board itself.

Patent Document 1; Japanese Patent Unexamined Publication No. 2007-165460

SUMMARY OF THE INVENTION

In view of the above-described problems, the present invention is directed to provide a multilayer printed wiring board which is prevented from optical deviation or improper connection of wires that occur in a conventional multilayer printed wiring board when it has warpage, and also to provide a mounting body using the board.

The multilayer printed wiring board of the present invention includes a plurality of printed wiring boards each having wiring on both sides thereof; and a relaxing connection layer for interconnecting the printed wiring boards, the relaxing connection layer containing an inorganic filler, a thermosetting resin, and a reliever for relieving internal stress.

With this structure, the multilayer printed wiring boards are prevented from warpage and undulation due to their difference in material or the coefficient of thermal expansion. Furthermore, a mounting body using such boards has higher precision, and lower cost and weight.

Figure 1:
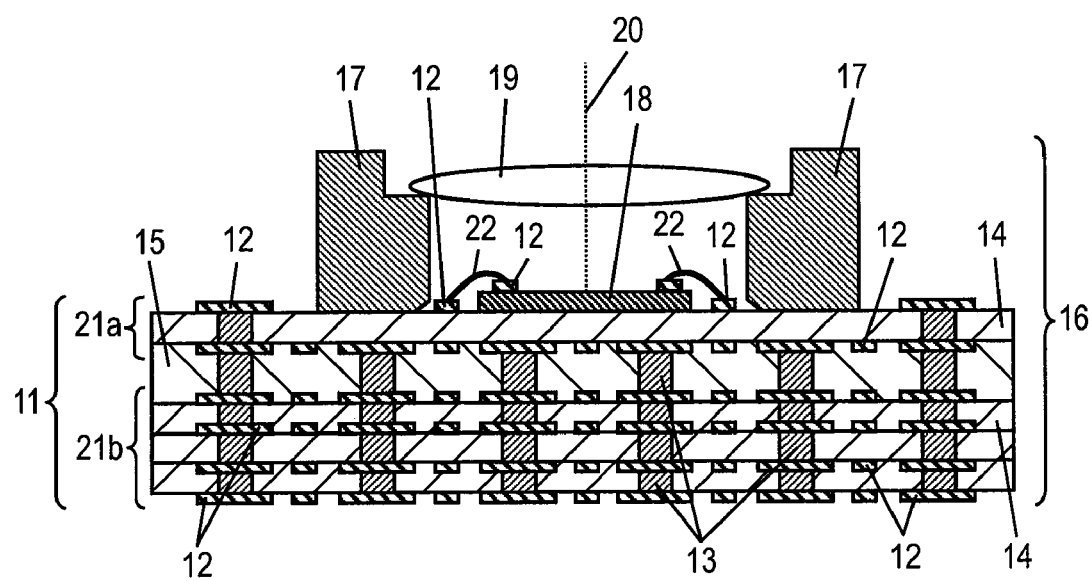
FIG. 1 is a sectional view of a mounting body using a multilayer printed wiring board according to a first exemplary embodiment of the present invention.

REFERENCE MARKS IN THE DRAWINGS 11 multilayer printed wiring board
12, 12a wiring
13 via
14 insulating layer
15 relaxing connection layer
16, 16a, 16b, 16c mounting body
17 holder
18 image pickup device
19 lens
20 optical axis
21a, 21b printed wiring board
22 wire
23 adhesive layer
24 warpage
24a, 24b, 24c internal stress
25 semiconductor device
26, 26a, 26b solder ball
27 crack

DETAILED DESCRIPTION OF PREFERRED EMBODIMENTS

First Exemplary Embodiment

A first exemplary embodiment of the present invention will be described as follows with reference to drawings.

FIG. 1 is a sectional view of a mounting body using a multilayer printed wiring board according to a first exemplary embodiment of the present invention.

As shown in FIG. 1, multilayer printed wiring board 11 includes printed wiring boards 21a and 21b, and relaxing connection layer 15 connecting them. Printed wiring boards 21a and 21b each have wiring 12 on its both sides. Relaxing connection layer 15 includes an inorganic filler, a thermosetting resin, and a reliever for relieving internal stress.

Printed wiring board 21a includes insulating layer 14, which is provided on its both sides with wiring 12 formed of a copper foil pattern. Insulating layer 14 can be formed, for example, by hardening a glass fiber impregnated with an epoxy resin. Printed wiring board 21a is provided on its top surface with holder 17 and image pickup device 18 surrounded by holder 17 as in the conventional wiring board. Holder 17 holds lens 19 having optical axis 20 at its upper part, and supports auto-focusing (not shown) of lens 17. Wiring 12 on image pickup device 18 and wiring 12 on printed wiring board 21a are connected by wires 22 of gold or aluminum by a wire bonder. Wiring 12 on both sides of printed wiring board 21a is electrically interconnected through vias 13 penetrating multilayer printed wiring board 11.

Printed wiring board 21b, on the other hand, is a laminated body composed of a plurality of printed wiring boards each having wiring 12 on its both sides, and a plurality of insulating layers 14 interposed between these boards. In short, printed wiring board 21b itself is a multilayer printed wiring board. Wiring 12 inside and on both sides of printed wiring board 21b is electrically interconnected in the vertical direction through vias 13 formed in insulating layers 14.

Relaxing connection layer 15 contains a reliever together with the inorganic filler in the thermosetting resin as described in detail later. The reliever relieves internal stress caused by heating and cooling during the mounting of components on multilayer printed wiring board 11 (for example, in a solder reflow process). Wiring 12 on one side of each of printed wiring boards 21a and 21b is embedded in relaxing connection layer 15. Relaxing connection layer 15 has a thickness of 30 to 300 µm. Thus, multilayer printed wiring board 11 has relaxing connection layer 15 inside so as to reduce surface warpage.

Multilayer printed wiring board 11 is provided on its top surface with lens 19, holder 17, and other optical components so as to form mounting body 16 for a camera module. The camera module is used in, for example, a mobile phone having a high-definition resolution of 2 million pixels or more. In short, in the present exemplary embodiment, the components mounted on printed wiring board 21a include holder 17, image pickup device 18, and lens 19.

Mounting body 16 can be a POP (Package On Package) or an optical module, besides the camera module. A POP can be composed of a plurality of multilayer printed wiring boards connected to each other. An optical module may be composed of a multilayer printed wiring board, and a combined unit of optical cables and circuit components which is mounted on the wiring board. An optical module may alternatively be an optical-electronic module including a light guide path, an LED (light emitting diode), or a semiconductor laser formed on the multilayer printed wiring board.

Figure 2A:
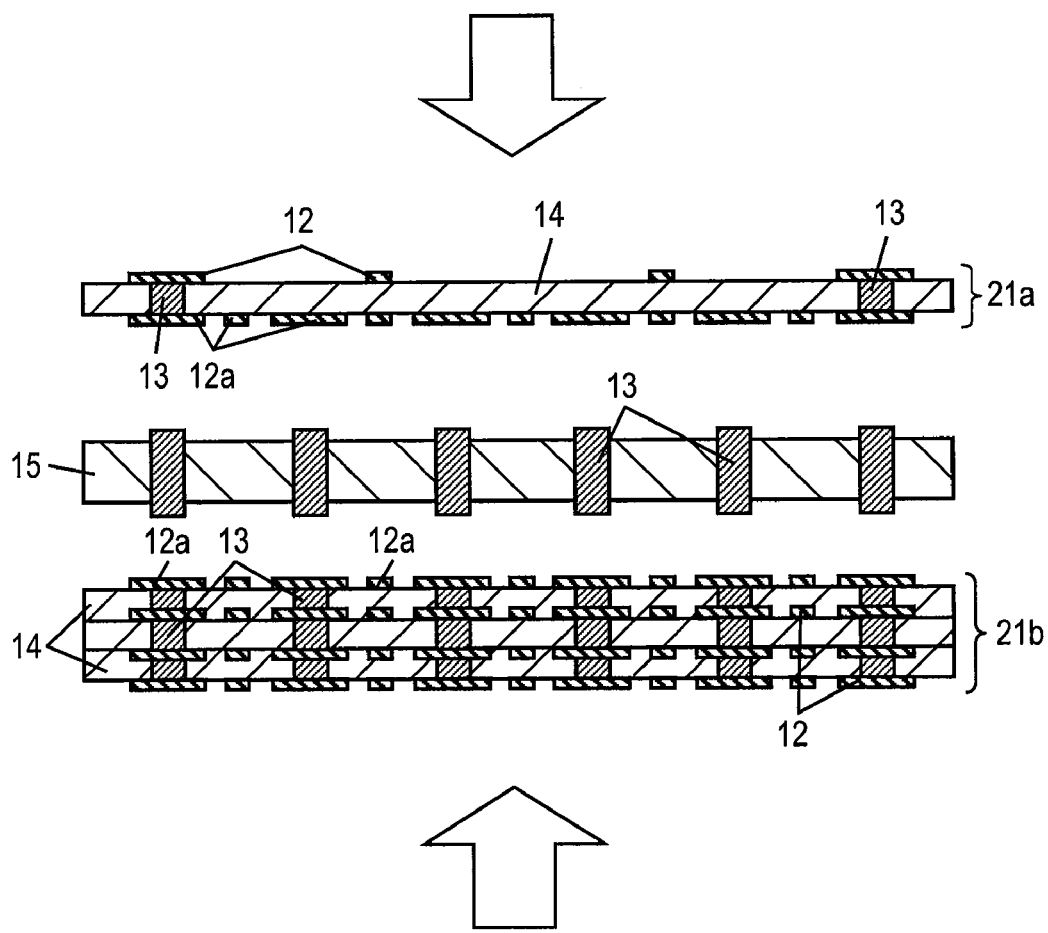
FIG. 2A is a sectional view showing a step of a method for manufacturing the multilayer printed wiring board according to the first exemplary embodiment of the present invention.
Figure 2B:
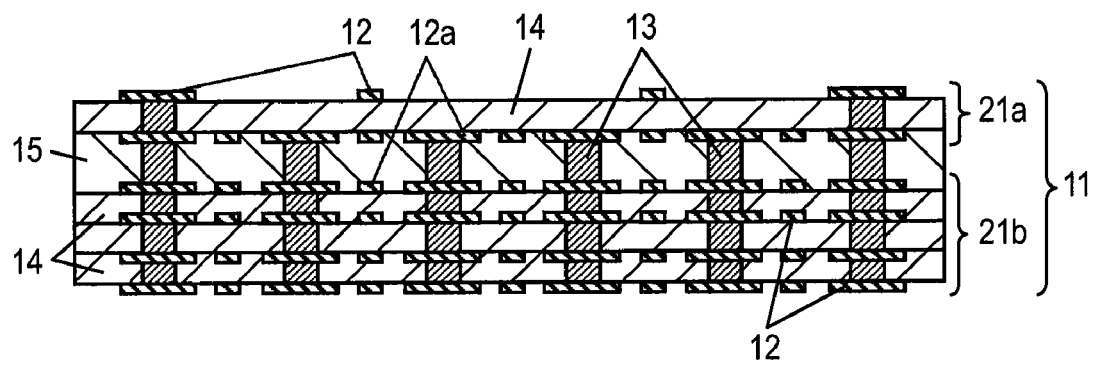
FIG. 2B is a sectional view showing another step of the method for manufacturing the multilayer printed wiring board according to the first exemplary embodiment of the present invention.

A method for manufacturing multilayer printed wiring board 11 of the present exemplary embodiment shown in FIG. 1 will be described with reference to FIGS. 2A and 2B. FIGS. 2A and 2B are sectional views showing steps of the method for manufacturing the multilayer printed wiring board according to the present exemplary embodiment.

First, as shown in FIG. 2A, the following is prepared: printed wiring board 21a having wiring 12 on its both sides; multilayer printed wiring board 21b having a plurality of layers of wiring 12 and a plurality of insulating layers 14; and relaxing connection layer 15 having vias 13 extending between both sides. Predetermined wiring 12 on both sides of printed wiring board 21a is interconnected through vias 13 formed in insulating layers 14. Wiring 12 inside and on both sides of printed wiring board 21b are also interconnected through vias 13 formed in insulating layers 14. Vias 13 in relaxing connection layer 15 are at positions corresponding to wiring 12 to which they are connected and which is formed on both sides of printed wiring boards 21a and 21b.

Printed wiring boards 21a and 21b can be formed, for example, by hardening a glass fiber with an epoxy resin (which are called glass epoxy boards), or by hardening an aramid fiber with an epoxy resin. Printed wiring board 21a can be a multilayer printed wiring board having two or more layers, instead of being a single-layer double-sided printed wiring board. Vias 13 in printed wiring boards 21a and 21b can be formed by plating (filled vias or plated through holes) instead of using an after-mentioned conductive paste.

Relaxing connection layer 15 is an insulating layer containing an inorganic filler, a thermosetting resin, and a reliever. Relaxing connection layer 15 is first perforated with holes using a laser or a drill, and then the holes are filled with a conductive paste (for example, a via paste made of copper power and epoxy resin) so as to form vias 13 as shown in FIG. 2A. In the present exemplary embodiment, relaxing connection layer 15 has a thickness of 30 to 300 µm.

Next, relaxing connection layer 15 is sandwiched between printed wiring boards 21a and 21b, and is applied with heat and pressure as shown by the arrows of FIG. 2A. As a result, relaxing connection layer 15 is softened, becoming more adhesive with printed wiring boards 21a and 21b. In FIG. 2A, printed wiring boards 21a and 21b each have wiring 12a out of wiring 12 on its side that faces relaxing connection layer 15. Wiring 12a is aggressively embedded in relaxing connection layer 15, improving the electrical connectivity with vias 13 in relaxing connection layer 15, and hence, reducing electrical resistance.

In FIG. 2A, vias 13 are projected from the surface of relaxing connection layer 15 by using, for example, a PET (polyethylene terephthalate) film, which will be described later. This increases the connection stability between relaxing connection layer 15 and wiring 12 on both sides of printed wiring boards 21a and 21b when they are stacked with pressure.

FIG. 2B is a sectional view of multilayer printed wiring board 11 gone through the step shown in FIG. 2A. In the step of FIG. 2A, wiring 12a on one side of printed wiring boards 21a and 21b is embedded in vias 13 of relaxing connection layer 15 when applied with heat and pressure as shown by the arrows. Thus, wiring 12a is embedded throughout its thickness in vias 13 of relaxing connection layer 15. This improves the electrical connectivity between wiring 12a and vias 13 of relaxing connection layer 15.

Holder 17, image pickup device 18, lens 19, and other components are mounted on the top surface of multilayer printed wiring board 11 shown in FIG. 2B so as to obtain mounting body 16 for the camera module shown in FIG. 1, which can be used in a mobile phone.

The following is a description of various components of multilayer printed wiring board 11. Relaxing connection layer 15 in the present exemplary embodiment is an insulating layer in which an inorganic filler and a reliever are dispersed in a thermosetting resin such as an epoxy resin. The reliever can be, for example, a thermoplastic resin such as an elastomer or a rubber.

Relaxing connection layer 15 preferably has a thickness of 30 to 300 µm. When the thickness is less than 30 µm, wiring 12 cannot be embedded enough to have excellent conductivity with vias 13. When the thickness exceeds 300 µm, on the other hand, vias 13 cannot be made compact to maintain their aspect ratio, or become less conductive with wiring 12 due to their large thickness.

Relaxing connection layer 15, which is an insulating layer, generally contains a core material of woven or nonwoven cloth, or film. In the present exemplary embodiment, however, relaxing connection layer 15 contains a small amount, preferably not more than 5% wt, of core material of woven or nonwoven cloth, or film. When the amount exceeds 5% wt, the core material prevents the internal stress from being relaxed, possibly making relaxing connection layer 15 less effective to prevent warpage. In addition, it becomes difficult to embed wiring 12 on one side of each of printed wiring boards 21a and 21b in relaxing connection layer 15. To ensure the embedding of wiring 12, relaxing connection layer 15 preferably does not contain a core material of woven or nonwoven cloth, or film. In other words, relaxing connection layer 15 is preferably composed exclusively of an inorganic filler, a thermosetting resin, and a reliever.

In the present exemplary embodiment, the inorganic filler contained in relaxing connection layer 15 is preferably made at least one of silica, alumina, and barium titanate. The inorganic filler preferably has a particle size of 0.1 to 15 µm. To prevent the conductive paste powder (which means powder contained in a conductive paste) from flowing, the inorganic filler is preferably smaller in particle size than the conductive paste. The conductive paste has a particle size of 1 to 20 µm, which is a normal size, and therefore, the practical particle size of the inorganic filler is 0.1 to 15 µm. Relaxing connection layer 15 preferably has an inorganic filler content of 70 to 90 wt %. When the inorganic filler content is less than 70%, relaxing connection layer 15 becomes coarse due to the small amount of the inorganic filler compared with the amount of the thermosetting resin. This causes the inorganic filler to be flown together with the thermosetting resin during the pressing process. When the content exceeds 90%, on the other hand, relaxing connection layer 15 has too low a resin content to allow the wiring to be fully embedded therein or to have sufficient adhesion thereto.

The elastomer used for the reliever in the present exemplary embodiment is either an acrylic elastomer or a thermoplastic elastomer. More specifically, the elastomer can be, for example, a polybutadiene- or butadiene-based random copolymer rubber, or a copolymer containing hard and soft segments. The elastomer content of the epoxy resin composition is preferably 0.2 to 5.0 wt %. When the elastomer content is less than 0.2 wt %, the resin flow increases, whereas when it exceeds 5.0 wt %, relaxing connection layer 15 increases its elasticity, making vias 13 less reliable.

In relaxing connection layer 15 in the present exemplary embodiment, the thermosetting resin contains the inorganic filler and either an elastomer or a rubber dispersed therein. This allows the elastomer to segregate to the surface of the inorganic filler, further reducing the fluidity of the inorganic filler.

The conductive paste to be filled into vias 13 of relaxing connection layer 15 in the present exemplary embodiment is preferably made at least one of copper, silver, gold, palladium, bismuth, tin, and alloys thereof, and has a particle size of 1 to 20 μm. The conductive paste generally has a particle size of 1 to 8 μm, but may have a maximum particle size of 20 μm depending on the variations in particle size distribution. Therefore, it is preferable to use the most available conductive paste, which has a particle size of 1 to 20 μm.

The above-described conductive paste is injected into relaxing connection layer 15 as follows. First, a PET film is pasted on both sides of relaxing connection layer 15. Then, through-holes are formed to extend between the two PET films. Next, the through-holes are filled with the conductive paste, thereby forming vias 13. As a result, relaxing connection layer 15 has the PET films on its both sides and vias 13 therein.

Relaxing connection layer 15 having the PET films thereon is pasted on printed wiring boards 21a and 21b as follows. First, the PET film on one side of relaxing connection layer 15 is peeled off, and relaxing connection layer 15 is applied to printed wiring board 21b. Then, the other PET film is peeled off, and printed wiring board 21a is applied to relaxing connection layer 15. The reason that the PET films on both sides of relaxing connection layer 15 are not peeled off at one time is that non-hardened relaxing connection layer 15 can be easily broken and is therefore difficult to handle. For this reason, one PET film on either side is peeled off before stacking. Thus, multilayer printed wiring board 11 is completed as shown in FIG. 2B.

As shown in FIGS. 2A and 2B, relaxing connection layer 15 and printed wiring boards 21a and 21b are stacked in such a manner that the conductive paste used for vias 13 of relaxing connection layer 15 is pressed with heat onto wiring 12 on one side of each of printed wiring boards 21a and 21b. During this stacking process, wiring 12 is embedded in relaxing connection layer 15. As a result, the conductive paste is further compressed, greatly increasing the conductivity with wiring 12.

Relaxing connection layer 15 preferably has a glass transition point Tg (measured by Dynamic Mechanical Analysis) of either not lower than 185° C. or higher by 10° C. or more than that of printed wiring boards 21a and 21b, which are respectively on and under relaxing connection layer 15. When the glass transition point Tg of relaxing connection layer 15 is either not lower than 185° C. or different by less than 10° C. from that of printed wiring boards 21a and 21b, these boards may have complex or irreversible warpage or undulation in a high temperature process such as reflow.

Figure 3:
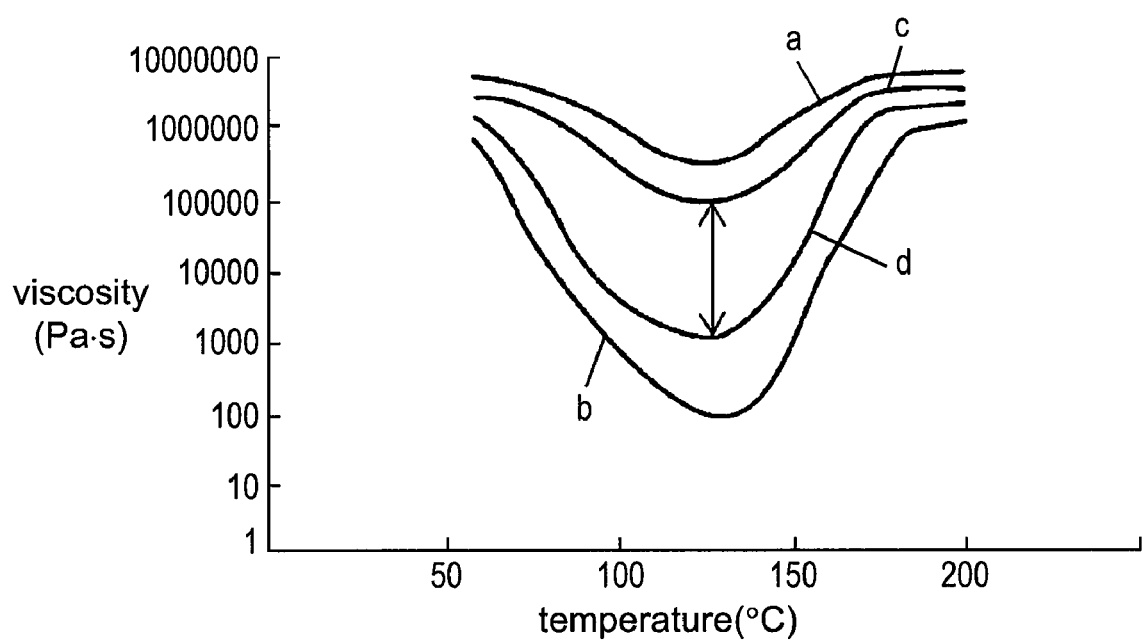
FIG. 3 shows melt viscosity curves of a relaxing connection layer in the multilayer printed wiring board according to the first exemplary embodiment of the present invention.

FIG. 3 shows melt viscosity curves of relaxing connection layer 15 according to the present exemplary embodiment. The curve "a" and the curve "b" show the uppermost value and the lowermost value, respectively, of relaxing connection layer 15 with the above-described conditions. The curve "c" and the curve "d" show the upper value and the lower value, respectively, of relaxing connection layer 15 with the above-described conditions. Thus, the lowest melt viscosity of relaxing connection layer 15 is appropriately 1000 to 100000 Pa·s as shown by the arrow in FIG. 3. When the lowest melt viscosity is less than 1000 Pa·s, the resin flow increases. When the lowest melt viscosity exceeds 100000 Pa·s, on the other hand, it becomes impossible to fully bond relaxing connection layer 15 to the printed wiring boards or to embed the wiring therein.

Relaxing connection layer 15 may contain a coloring agent, which improves mounting properties and light reflectivity of an optical device.

The thermosetting resin contained in relaxing connection layer 15 can be at least one selected from an epoxy resin, a polybutadiene resin, a phenol resin, a polyimide resin, a polyamide resin, and a cyanate resin.

Relaxing connection layer 15 is never formed on the outermost of multilayer printed wiring board 11. If done so, relaxing connection layer 15 does not exhibit the effect of relaxing the internal stress between printed wiring boards 21a and 21b. Relaxing connection layer 15 can be used as a layer to bond between printed wiring boards 21a and 21b stacked together so as to obtain a high production yield and to reduce costs.

Relaxing connection layer 15 in the present exemplary embodiment preferably has a coefficient of thermal expansion of not higher than 65 ppm/° C., and preferably lower than printed wiring boards 21a and 21b. When the coefficient of thermal expansion of relaxing connection layer 15 is higher than either that of printed wiring boards 21a and 21b or 65 ppm/° C., relaxing connection layer 15 may not sufficiently absorb the internal stress caused by heating and cooling.

Printed wiring boards 21a and 21b may be any resin boards such as through-hole wiring boards, or ALIVH (any layer inner via hole) boards. Printed wiring boards 21a and 21b may be either double-sided or multilayer boards. It is also possible to stack printed wiring boards 21 and a plurality of relaxing connection layers 15 alternately on each other.

The insulating material used for printed wiring boards 21a and 21b in the present exemplary embodiment is a composite of a glass woven fabric and an epoxy resin. Alternatively, the insulating material may be a composite of a thermosetting resin and an organic woven fiber of either aramid or wholly aromatic polyester. Further alternatively, the insulating material may be a composite of a thermosetting resin and a non-woven cloth that is either a glass fiber or an organic fiber selected from p-aramid, polyimide, poly-p-phenylene benzobisoxazole, wholly aromatic polyester, PTFE, poly(ethersulfone), and polyetherimide. Further alternatively, the insulating material may be a composite of a synthetic resin film and a thermosetting resin layer formed on both sides thereof. The synthetic resin film can be at least one of p-aramid, poly-p-phenylene benzobisoxazole, wholly aromatic polyester, polyetherimide, polyetherketone, polyetheretherketone, polyethylene terephthalate, polytetrafluoroethylene, polyethersulfone, polyester terephthalate, polyimide, and polyphenylene sulfide.

Figure 12:
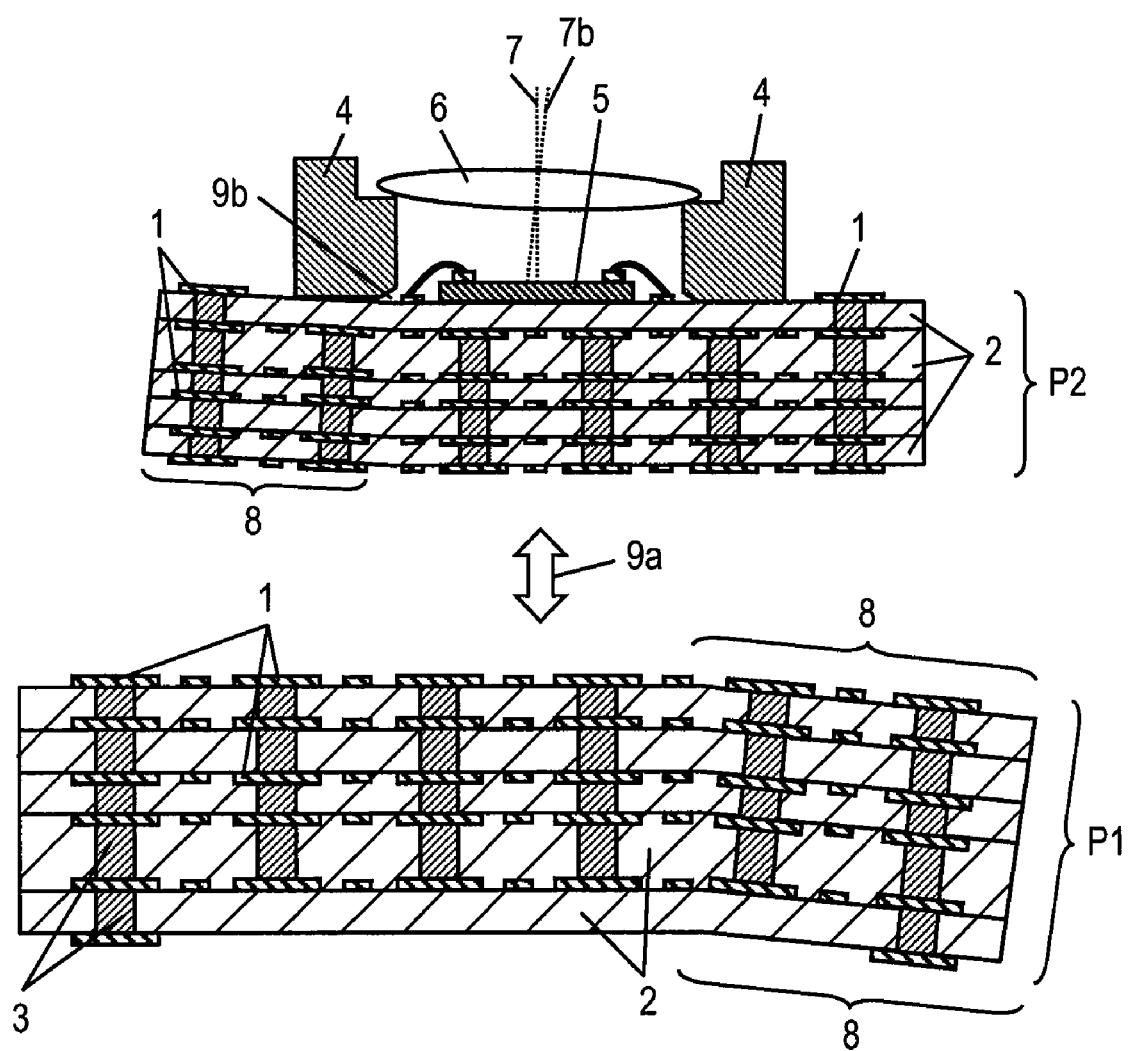
FIG. 12 is a sectional view showing the warpage problem of the conventional multilayer printed wiring boards.

Mounting body 16 for the camera module manufactured as described above is shown in FIG. 1. In FIG. 1, multilayer printed wiring board 11 includes relaxing connection layer 15 as its inner layer so as to reduce surface warpage. As a result, mounting body 16 including multilayer printed wiring board 11 as shown in FIG. 1 is prevented from warpage when the internal stress is caused by heating and cooling in, for example, a solder reflow process. Therefore, when mounting body 16 is reflow soldered on another printed wiring board such as the motherboard for a mobile phone, holder 17 and multilayer printed wiring board 11 do not have warpage 8 or gap 9b therebetween as shown in FIG. 12, regardless of their difference in the coefficient of thermal expansion. In the same manner, no warpage 8 or peeling 9a shown FIG. 12 occurs between mounting body 16 and the other printed wiring board on which mounting body 16 is mounted.

Thus, multilayer printed wiring board 11 including relaxing connection layer 15 as its inner layer is prevented from warpage, which is likely to occur in a solder reflow process.

Figure 4A:
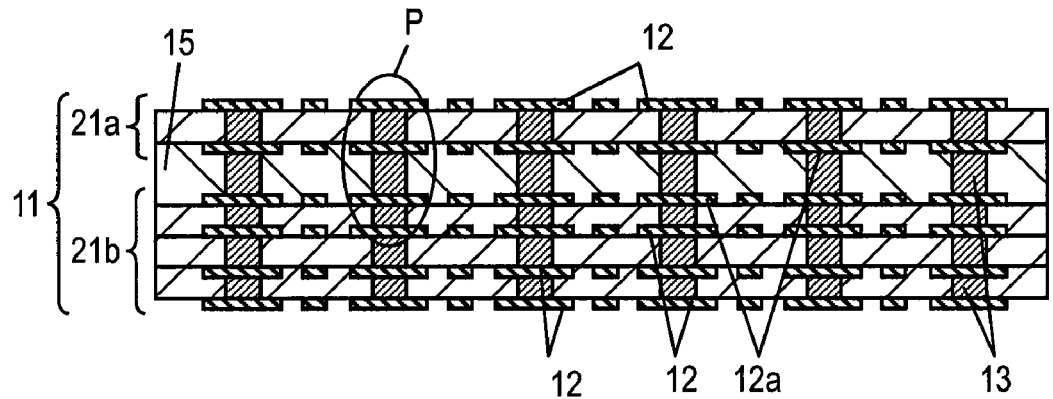
FIG. 4A is a sectional view of the multilayer printed wiring board of FIG. 1.
Figure 4B:
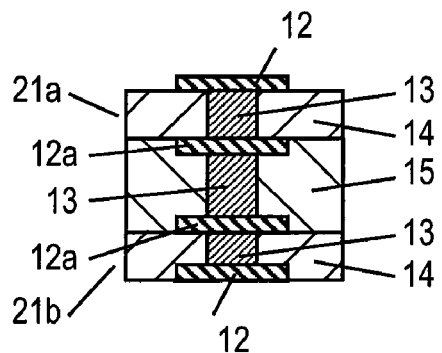
FIG. 4B is a partially enlarged sectional view of FIG. 4A.

FIG. 4A is a sectional view of multilayer printed wiring board 11 of the present exemplary embodiment shown in FIG. 1. FIG. 4B is an enlarged sectional view of an area "P" of FIG. 4A.

In FIG. 4A, multilayer printed wiring board 11 is an integrated combination of two-layer printed wiring board 21a, four-layer printed wiring board 21b, and relaxing connection layer 15 sandwiched therebetween. As shown in FIG. 4B, wiring 12a on one side of each of printed wiring boards 21a and 21b is embedded in relaxing connection layer 15. Wiring 12a on one side of each of printed wiring boards 21a and 21b is thus embedded in relaxing connection layer 15 so as to compress vias 13 of relaxing connection layer 15 to a degree corresponding to the thickness of wiring 12a. As a result, the reliability of via 13 is improved, thereby reducing the electrical resistance.

Figure 4C:
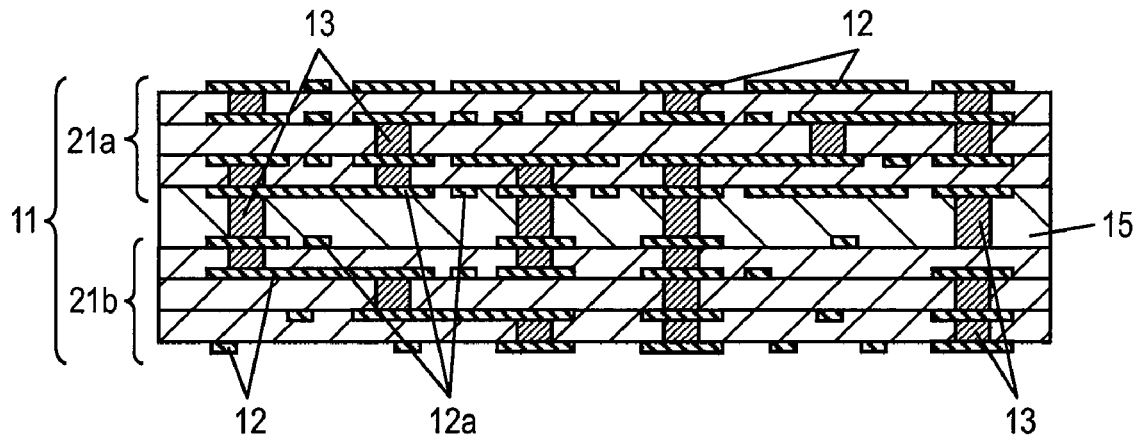
FIG. 4C is a sectional view of another example of the multilayer printed wiring board of FIG. 1.

FIG. 4C shows multilayer printed wiring board 11, which is an integrated combination of four-layer printed wiring board 21a, four-layer printed wiring board 21b, and relaxing connection layer 15 sandwiched therebetween. This eight-layer multilayer printed wiring board 11 is formed by combining separately prepared non-defective four-layer printed wiring boards 21a and 21b with a relaxing connection layer sandwiched therebetween. This provides a higher production yield than in the case of forming eight-layer printed wiring board 11 at one time.

In FIGS. 1 and 4A to 4C, relaxing connection layer 15 includes vias 13, but vias 13 are not essential. A similar effect can be obtained as long as a plurality of printed wiring boards are stacked on each other with a relaxing connection layer therebetween.

As described above, in the present exemplary embodiment, multi- or single-layer printed wiring boards 21a and 21b can be integrated with each other with relaxing connection layer 15 sandwiched therebetween to be prevented from warpage during heating and cooling.

Figure 5A:
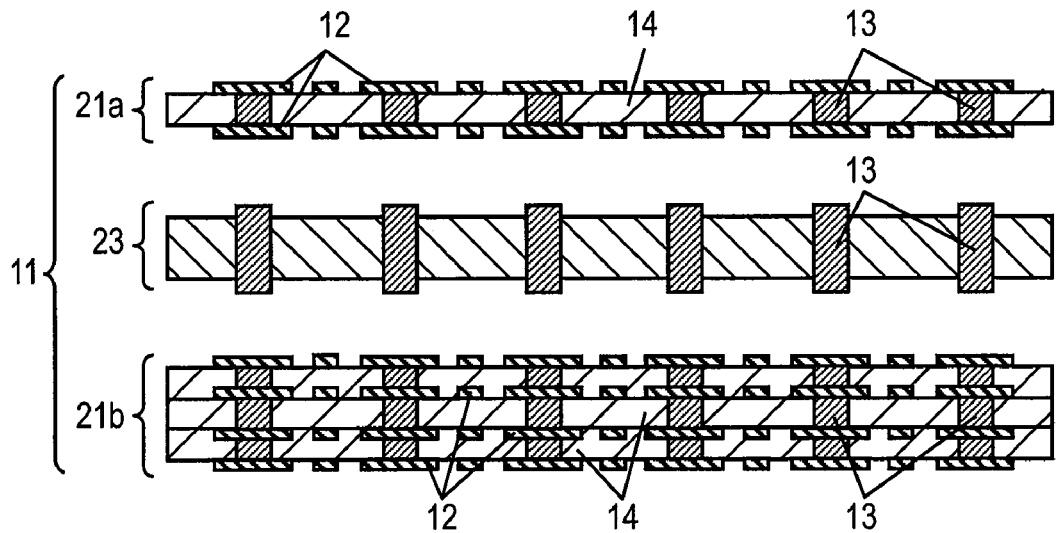
FIG. 5A is a sectional view showing a mechanism to reduce warpage of the multilayer printed wiring board according to the first exemplary embodiment.
Figure 5B:
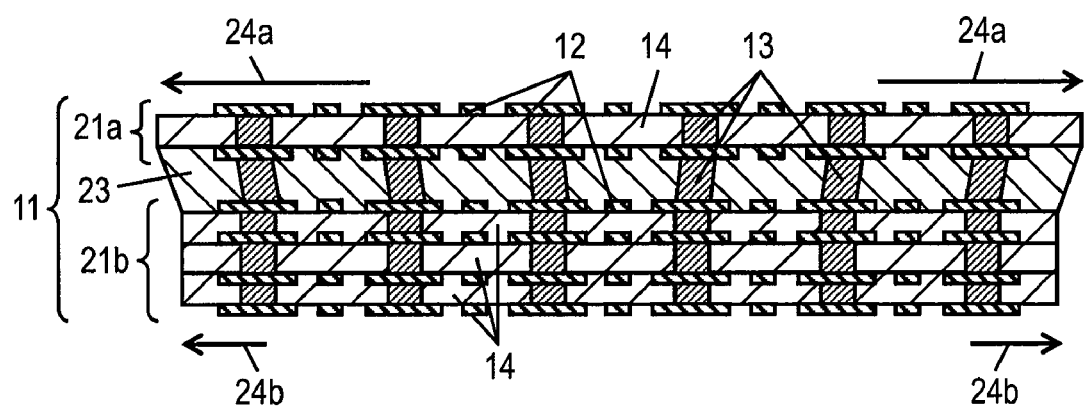
FIG. 5B is another sectional view showing the mechanism to reduce warpage of the multilayer printed wiring board according to the first exemplary embodiment.
Figure 5C:
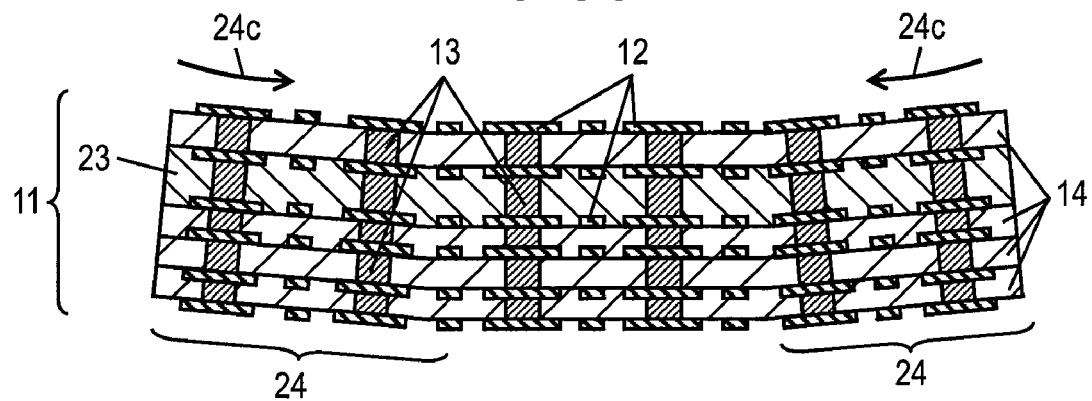
FIG. 5C is another sectional view showing the mechanism to reduce warpage of the multilayer printed wiring board according to the first exemplary embodiment.

A mechanism to reduce warpage of the multilayer printed wiring board 11 of the present exemplary embodiment will be described as follows with reference to FIGS. 5A to 5C and 6A to 6C. FIGS. 5A to 5C are sectional views showing the mechanism to cause warpage of multilayer printed wiring board 11 including an ordinary adhesive layer.

In FIG. 5A, multilayer printed wiring board 11 is an integrated combination of printed wiring boards 21a and 21b each having wiring 12 on its both sides and conventional adhesive layer 23 disposed therebetween. Adhesive layer 23 can be, for example, a prepreg formed by impregnating a commercially available glass fiber with an epoxy resin.

FIG. 5B is a sectional view of multilayer printed wiring board 11 in which wiring 12 on one side of each of printed wiring boards 21a and 21b is embedded in conventional adhesive layer 23 shown in FIG. 5A. As shown by the arrows of FIG. 5B, printed wiring boards 21a and 21b are subjected to internal stresses (or extensions) 24a and 24b during heating of multilayer printed wiring board 11. The lengths of the arrows indicate the magnitudes of internal stresses 24a and 24b (or the amounts of extensions of the boards during heating). In FIG. 5B, internal stress 24a is greater than internal stress 24b (internal stress 24a>internal stress 24b). This phenomenon occurs, for example, when printed wiring board 21a has a higher coefficient of thermal expansion than printed wiring board 21b. Printed wiring board 21a greatly extends as shown by internal stress 24a, which causes adhesive layer 23 to extend in the same manner.

FIG. 5C shows printed wiring boards 21a, 21b subjected to internal stresses (or shrinkage) during cooling of multilayer printed wiring board 11, opposite to the case of FIG. 5B. As shown by internal stress 24c, a printed wiring board having a higher coefficient of thermal expansion (for example, printed wiring board 21a) shrinks greatly. As a result, as shown in FIG. 5C, multilayer printed wiring board 11 is subjected to convex (or concave) warpage 24 in its bottom (or top) surface. The reason for this is that conventional adhesive layer 23 is thermoset during heating shown in FIG. 5B.

The magnitude, direction, and degree of warpage 24 depend on various conditions of printed wiring boards 21a and 21b. Warpage 24 is caused by small differences between printed wiring boards 21a and 21b, such as the variations in material, thickness, or copper foil pattern size. These differences are due to the difference in the coefficient of thermal expansion between wiring 12 made of copper foil and insulating layers 14 made of a glass epoxy resin or other resins. Furthermore, even within a single printed wiring board, warpage is different from part to part according to the difference in the degree of fineness of wiring 12. Warpage can also occur according to the difference in the number of layers between printed wiring boards 21a and 21b. For example, a six-layer printed wiring board consisting of a two-layer board and a four-layer board is likely to be subjected to the internal stresses shown in FIG. 5B or 5C. Also, the difference in the remaining copper rate affects the warpage. For example, the larger the remaining copper rate, the more the coefficient of thermal expansion of the copper foil is dominant.

FIGS. 5A to 5C show the case in which warpage 24 is caused by heating and cooling during manufacture, but may be caused by heating and cooling even after manufacture (after multilayer printed wiring board 11 is completed as a product). Warpage 24 is caused by the difference in the coefficient of thermal expansion between hardened conventional adhesive layer 23 and printed wiring boards 21a and 21b.

Figure 6A:
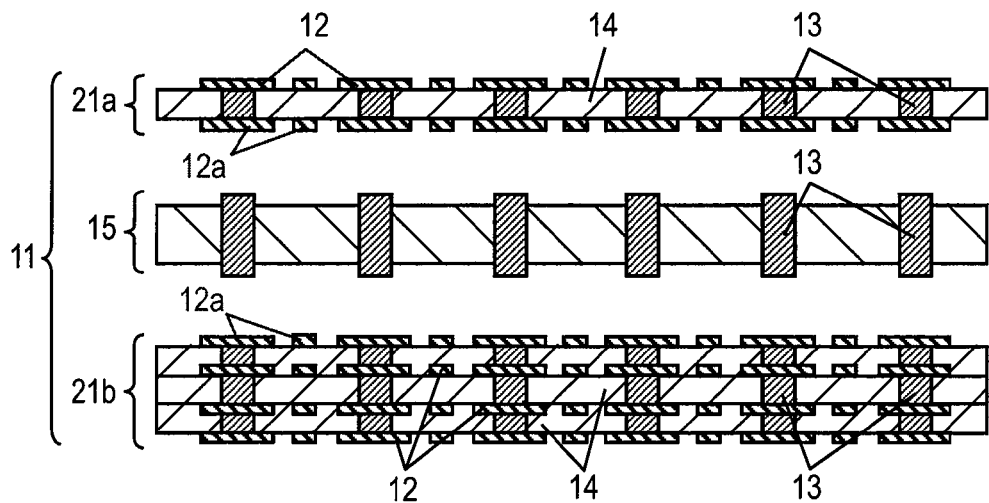
FIG. 6A is another sectional view showing the mechanism to reduce warpage of the multilayer printed wiring board according to the first exemplary embodiment.
Figure 6B:
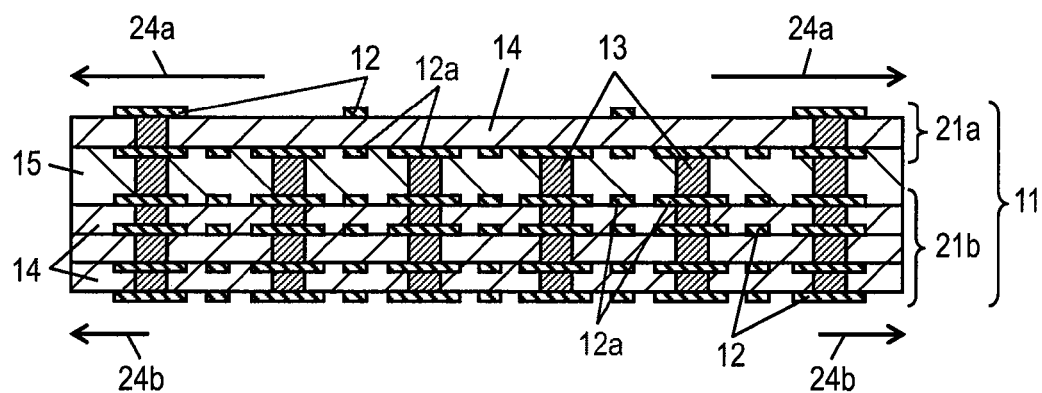
FIG. 6B is another sectional view showing the mechanism to reduce warpage of the multilayer printed wiring board according to the first exemplary embodiment.
Figure 6C:
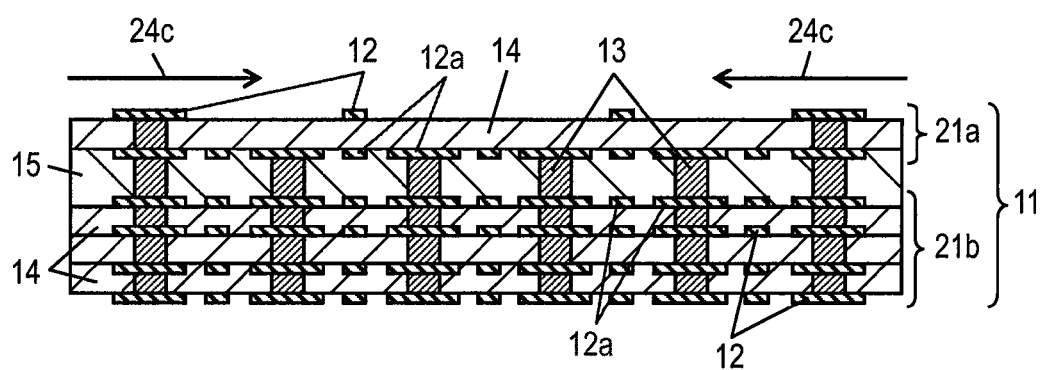
FIG. 6C is another sectional view showing the mechanism to reduce warpage of the multilayer printed wiring board according to the first exemplary embodiment.

The following is a description, with reference to FIGS. 6A to 6C, of the mechanism to prevent warpage of multilayer printed wiring board 11 including relaxing connection layer 15.

In FIG. 6A, multilayer printed wiring board 11 is an integrated combination of printed wiring boards 21a and 21b each having wiring 12 on its both sides and relaxing connection layer 15 disposed therebetween.

FIG. 6B is a sectional view of multilayer printed wiring board 11 in which wiring 12 on one side of each of printed wiring boards 21a and 21b is embedded in relaxing connection layer 15 shown in FIG. 6A. As shown in FIG. 6B, printed wiring boards 21a and 21b are subjected to internal stresses (or extensions) 24a and 24b during heating of multilayer printed wiring board 11, for example, in a solder reflow process. The lengths of the arrows indicate the magnitudes of internal stresses 24a and 24b (or the amount of extensions of the boards during heating). In FIG. 6B, internal stress 24a is greater than internal stress 24b (internal stress 24a>internal stress 24b). This phenomenon occurs, for example, when printed wiring board 21a has a higher coefficient of thermal expansion than printed wiring board 21b. In the present exemplary embodiment, however, when internal stress 24a occurs in printed wiring board 21a, it is relaxed by relaxing connection layer 15.

FIG. 6C shows printed wiring boards 21 subjected to internal stresses (or shrinkage) during cooling of multilayer printed wiring board 11. As shown in internal stress 24c, a printed wiring board having a larger coefficient of thermal expansion (for example, printed wiring board 21a) shrinks greatly. In the present exemplary embodiment, however, internal stress 24c is relaxed by relaxing connection layer 15.

The above-mentioned heating and cooling are performed, for example, in the following situations: when the components of multilayer printed wiring board 11 shown in FIGS. 6B and 6C are stacked with heat, or when various electronic components (such as a chip part and a semiconductor) are reflow soldered on completed multilayer printed wiring board 11. Especially in recent years, lead-free solder used for soldering increases the solder reflow temperature, and hence, the temperature range of heating and cooling, thereby making warpage more likely to occur than before. In the present exemplary embodiment, however, warpage of multilayer printed wiring board 11 is prevented by the function of relaxing connection layer 15 to absorb the internal stress occurring during heating and cooling.

Since relaxing connection layer 15 has a lower coefficient of thermal expansion than printed wiring boards 21a and 21b, the occurrence of warpage due to the difference in thermal expansion between printed wiring boards 21a and 21b is reduced even when multilayer printed wiring board 11 is heated or cooled after manufacture. Relaxing connection layer 15 has a higher glass transition point Tg, and hence, higher elasticity than printed wiring boards 21a and 21b in the temperature range for reflow. The temperature range is, for example, from room temperature to 260° C. As a result, relaxing connection layer 15 has the effect of reducing warpage of the entire multilayer printed wiring board.

Second Exemplary Embodiment

Figure 7A:
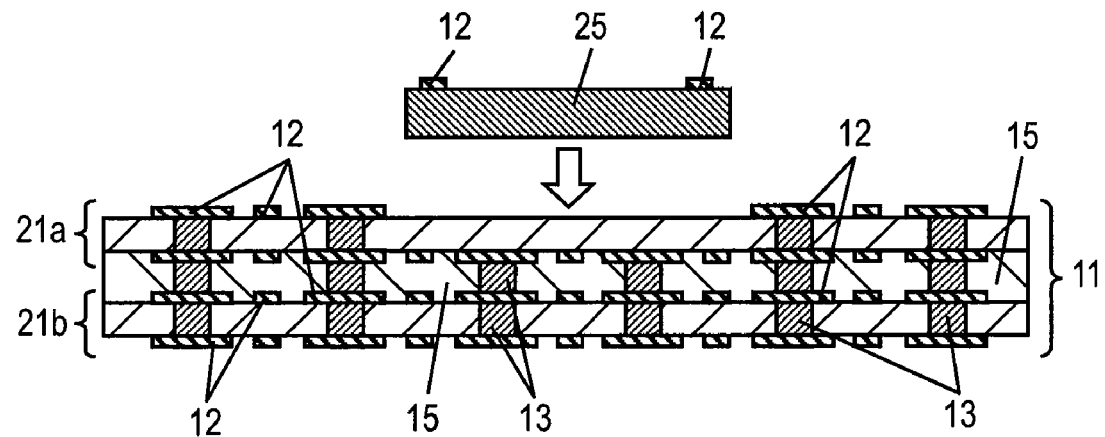
FIG. 7A is a sectional view showing a method for manufacturing a POP, which is a mounting body using a multilayer printed wiring board according to a second exemplary embodiment of the present invention.
Figure 7B:
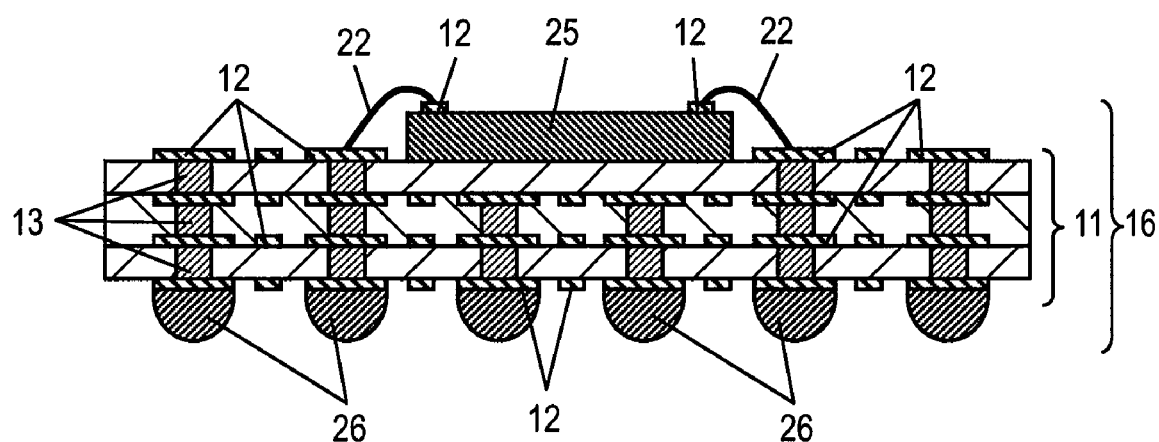
FIG. 7B is another sectional view showing the method for manufacturing the POP, which is the mounting body using the multilayer printed wiring board according to the second exemplary embodiment of the present invention.

FIGS. 7A and 7B are sectional views showing a method for manufacturing a POP, which is a mounting body using a multilayer printed wiring board according to a second exemplary embodiment of the present invention.

In FIG. 7A, multilayer printed wiring board 11 is formed by stacking printed wiring boards 21a and 21b on and under relaxing connection layer 15. Printed wiring boards 21a and 21b are single layers, and each have wiring 12 on its both sides which is interconnected through vias 13. As described in the first exemplary embodiment, in heating and cooling processes for manufacturing multilayer printed wiring board 11, the difference in the coefficient of thermal expansion between printed wiring boards 21a and 21b is influential. As described above, the difference in the coefficient of thermal expansion between printed wiring boards 21a and 21b is due, for example, to the variations in the remaining copper rate, the coefficient of thermal expansion of the wiring boards, and the degree of fineness of wiring 12. In the present exemplary embodiment, however, as described in the first exemplary embodiment, relaxing connection layer 15 absorbs the influence of the difference in the coefficient of thermal expansion between printed wiring boards 21a and 21b. As a result, multilayer printed wiring board 11 is not affected by the warpage caused in the heating and cooling processes. Next, semiconductor device 25 is positioned and fixed as shown by the arrow on multilayer printed wiring board 11.

Then, as shown in FIG. 7B, wiring 12 on semiconductor device 25 is connected to wiring 12 on printed wiring board 21a through wires 22 and other devices, thereby completing mounting body 16. In the present exemplary embodiment, the components mounted on multilayer printed wiring board 11 include semiconductor device 25, wiring 12, and wires 22.

Mounting body 16 can be an interposer (a kind of circuit board interposed between fine semiconductor chips and a general printed wiring board) or a package for a POP. Mounting body 16 is connected to another printed wiring board such as a motherboard by reflow soldering via solder balls 26 formed on the bottom surface of printed wiring board 21b.

To achieve a high density motherboard for a mobile phone or other similar devices, it is preferable to form a POP on the motherboard. Using a POP can reduce the number of solder mounting processes, for example, to one time, thereby increasing the productivity of a mobile phone or other similar devices. Solder mounting, however, tends to cause warpage of printed wiring boards used in a POP (a printed wiring board on which a semiconductor is mounted, or a printed wiring board as a motherboard) in a solder reflow process.

In the case in which mounting body 16 is mounted on a motherboard via solder balls 26 as shown in FIG. 7B, a conventional BGA has a pitch of 1 mm or so, and solder balls 26 have a large diameter (for example, 800 μm). In recent years, however, BGAs have a larger number of IOs (inputs and outputs) and packages are more compact than before. This makes it necessary to form a large number of solder balls 26 in a limited area, thereby decreasing their diameter (for example, 500 μm or smaller). As a result, even a slight warpage of printed wiring board 11 mounted on the motherboard has great influence on mounting properties. The warpage, however, can be reduced by using multilayer printed wiring board 11 including relaxing connection layer 15 disposed between printed wiring boards 21a and 21b as shown in FIG. 7B.

Figure 8A:
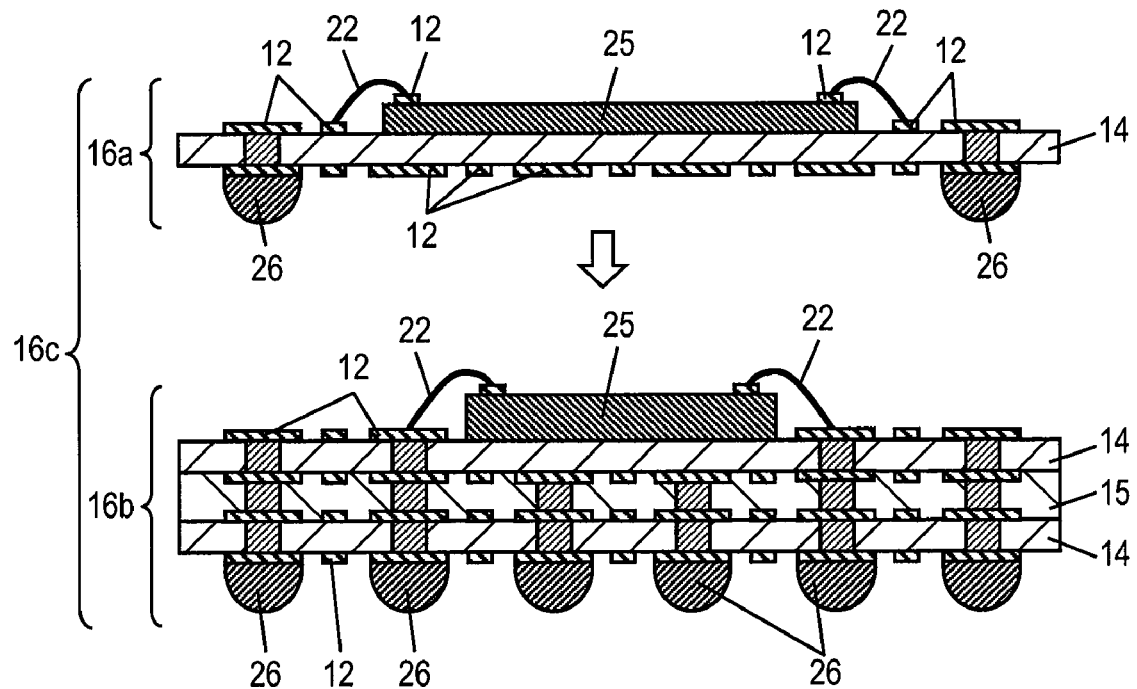
FIG. 8A is a sectional view showing a step of manufacturing another POP according to the second exemplary embodiment of the present invention.
Figure 8B:
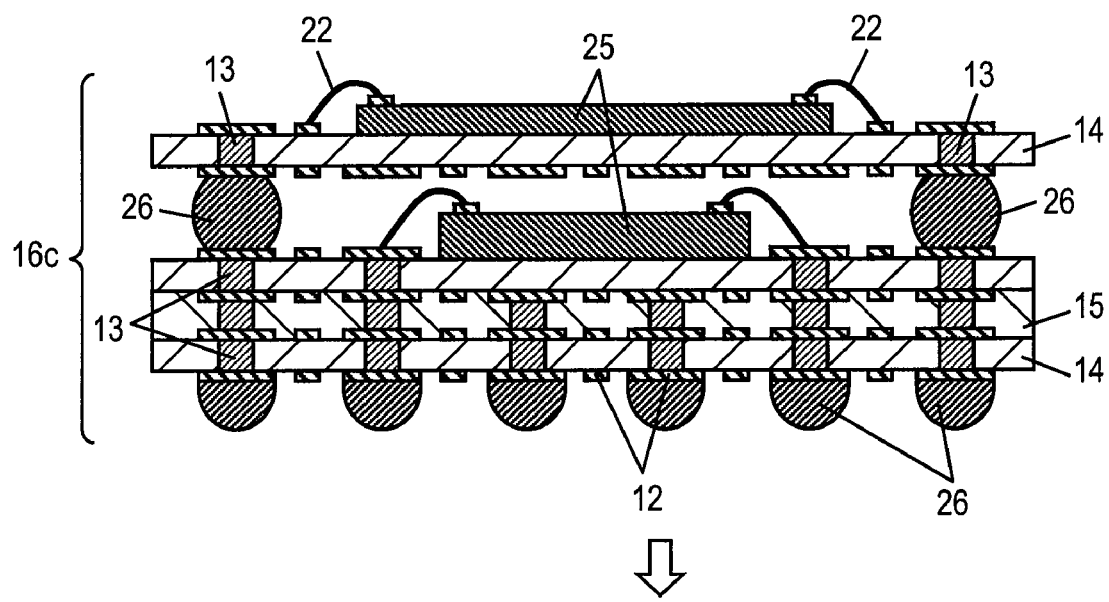
FIG. 8B is a sectional view showing another step of manufacturing the POP according to the second exemplary embodiment of the present invention.

FIGS. 8A and 8B are sectional views showing steps of manufacturing another POP. FIG. 8A shows how mounting bodies 16a and 16b are stacked on each other via solder balls 26. In FIG. 8A, mounting body 16b is obtained by the method shown in FIGS. 7A and 7B. Mounting body 16a, on the other hand, is composed of single insulating layer 14 having wiring 12 on its both sides, and semiconductor device 25 formed on the top surface thereof. Wiring 12 on the top surface of mounting body 16b is connected to solder balls 26 of mounting body 16a, and mounting body 16b is stacked on mounting body 16a as shown by the arrow, thereby obtaining mounting body 16c shown in FIG. 8B as a POP. Alternatively, not only mounting body 16b, but also mounting body 16a can be formed using a multilayer printed wiring board including relaxing connection layer 15 to improve their mounting properties and to use smaller solder balls 26.

Mounting body 16c of FIG. 8B is mounted as shown by the arrow on another circuit board (not shown) such as a motherboard for a mobile phone.

Figure 9A:
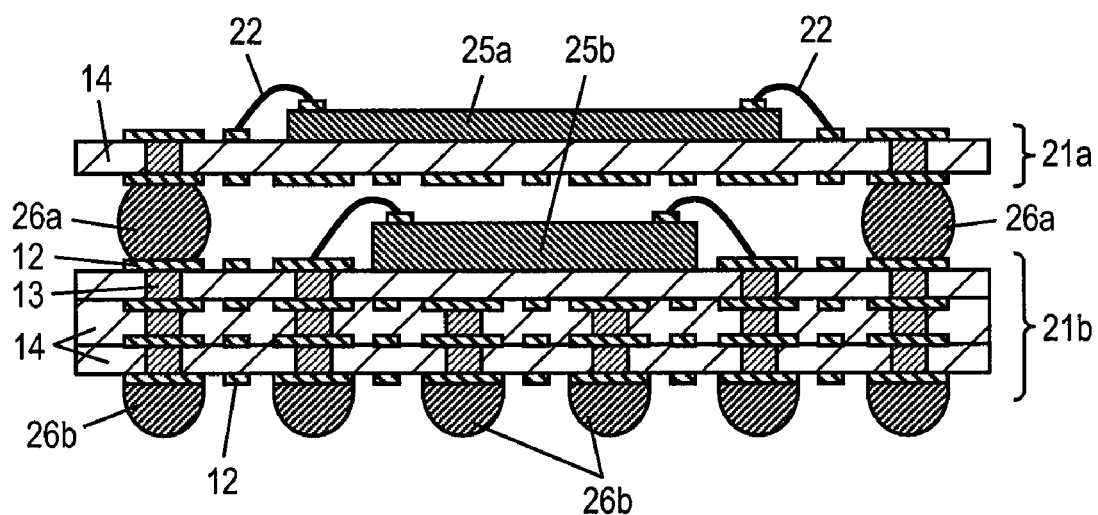
FIG. 9A is a sectional view showing the influence of warpage on a POP.
Figure 9B:
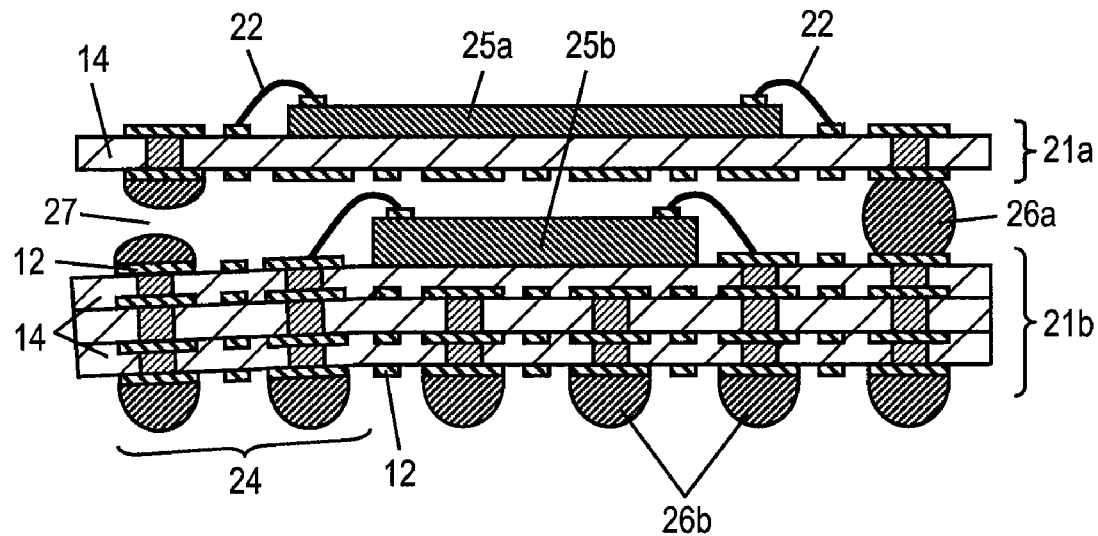
FIG. 9B is another sectional view showing the influence of warpage on the POP.

The influence of warpage on the POP will be described as follows with reference to FIGS. 9A and 9B. FIG. 9A is a POP, which is obtained by the conventional method and has the same structure as the mounting body shown in FIG. 8B. In FIG. 9A, the POP as a mounting body is composed of multilayer printed wiring board 21b, and single-layer printed wiring board 21a stacked on the top surface thereof via solder balls 26a. In single-layer printed wiring board 21a, wiring 12 on the surface of insulating layer 14 is connected to semiconductor device 25a through wires 22. Wiring 12 on both sides of insulating layer 14 is interconnected through vias 13 penetrating single-layer printed wiring board 21a. In multilayer printed wiring board 21b, wiring 12 on the surface of a laminated body of three insulating layers 14 is connected to semiconductor device 25b through wires 22. Wiring 12 inside and on both sides of multilayer printed wiring board 21b is interconnected through vias 13 penetrating multilayer printed wiring board 21b. Thus, multilayer printed wiring board 21b obtained by the conventional method is composed exclusively of insulating layers 14 stacked on each other. Multilayer printed wiring board 21b and single-layer printed wiring board 21a compose the mounting body, which is mounted on another printed wiring board such as a motherboard via solder balls 26b.

Multilayer printed wiring board 21b is heated and cooled when single-layer printed wiring board 21a is mounted on multilayer printed wiring board 21b via solder balls 26a or when the mounting body composed of single-layer printed wiring board 21a and multilayer printed wiring board 21b is mounted on another printed wiring board via solder balls 26b. At this moment, multilayer printed wiring board 21b is likely to be subjected to warpage 24 as shown in FIG. 9B according to the remaining copper rate, the presence or absence of wiring patterns, the thickness of the board, and other conditions. As a result, solder balls 26a may develop cracks 27.

Especially in the case of multilayer printed wiring board 21b formed by hardening a glass fiber with an epoxy resin, it becomes difficult to mount multilayer printed wiring board 21b on another printed wiring board when warpage 24 per 10 mm square exceeds 150 μm. Furthermore, there are other possible problems such as the initial failure or unstable reliability of the mounting body, and the detachment or stretch of solder ball 26a.

The use, however, of multilayer printed wiring board 11 including relaxing connection layer 15 shown in FIGS. 7A and 7B can reduce the amount of warpage per 10 mm square to 150 μm or less. This is because relaxing connection layer 15 relaxes the warpage of printed wiring board 11. The amount of warpage can be reduced to 30% or less of the diameter of solder balls 26 by controlling the thickness, composition, or other conditions of relaxing connection layer 15. When the amount of warpage of multilayer printed wiring board 11 is reduced to 30% or less of the diameter of solder balls 26, solder balls 26 can be prevented from wear and cracks 27.

Third Exemplary Embodiment

Figure 10A:
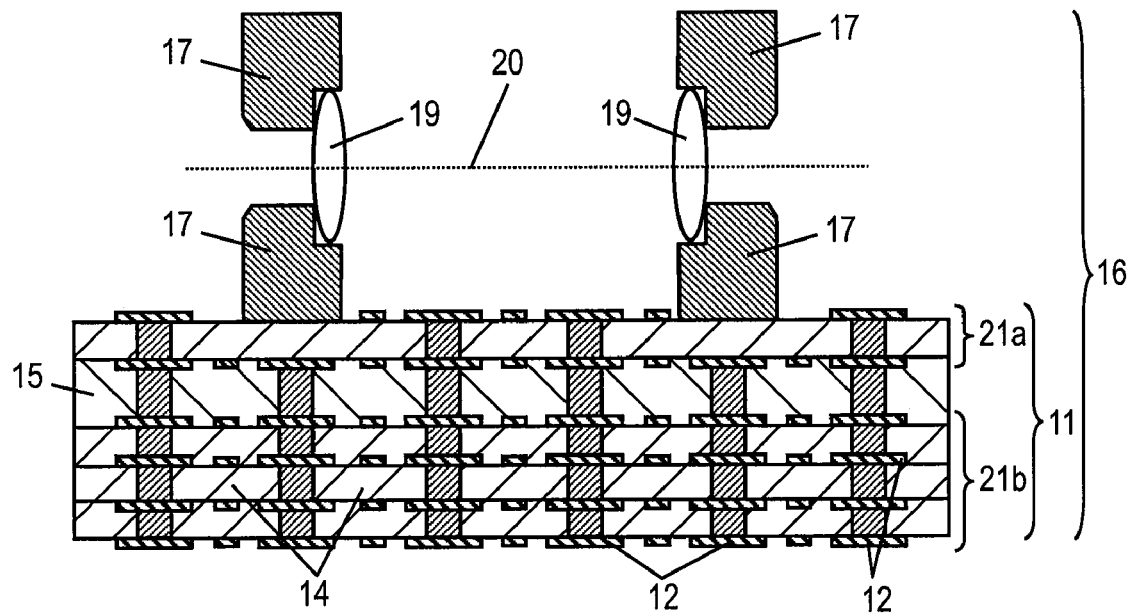
FIG. 10A is a sectional view of an optical module, which is a mounting body using a multilayer printed wiring board according to a third exemplary embodiment of the present invention.
Figure 10B:
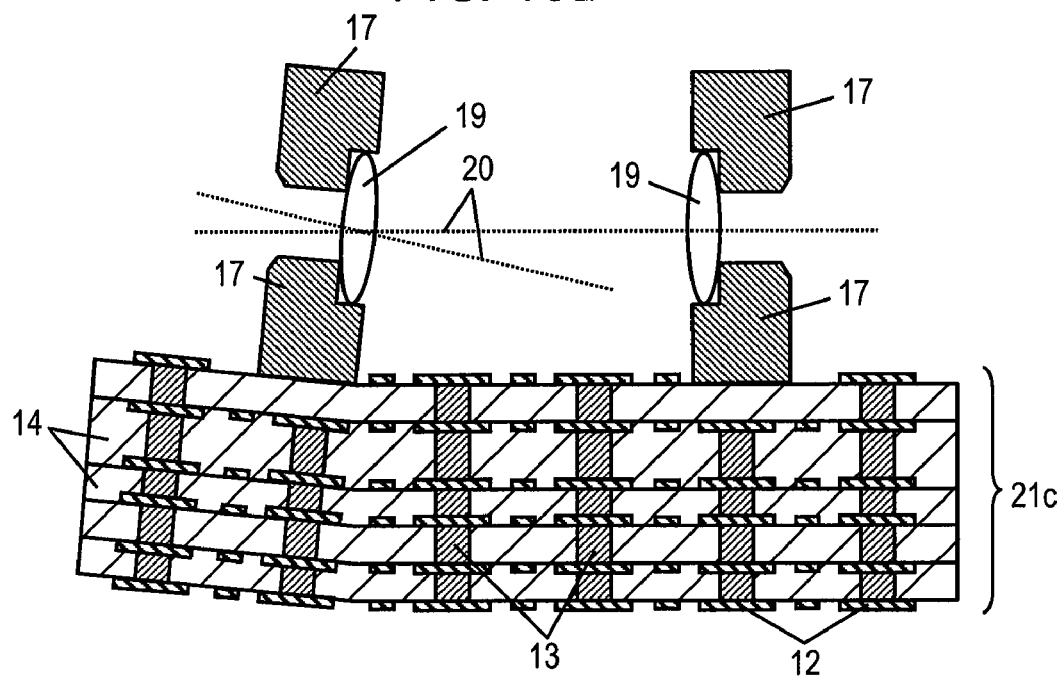
FIG. 10B is another sectional view of the optical module, which is the mounting body using the multilayer printed wiring board according to the third exemplary embodiment of the present invention.
Figure 11:
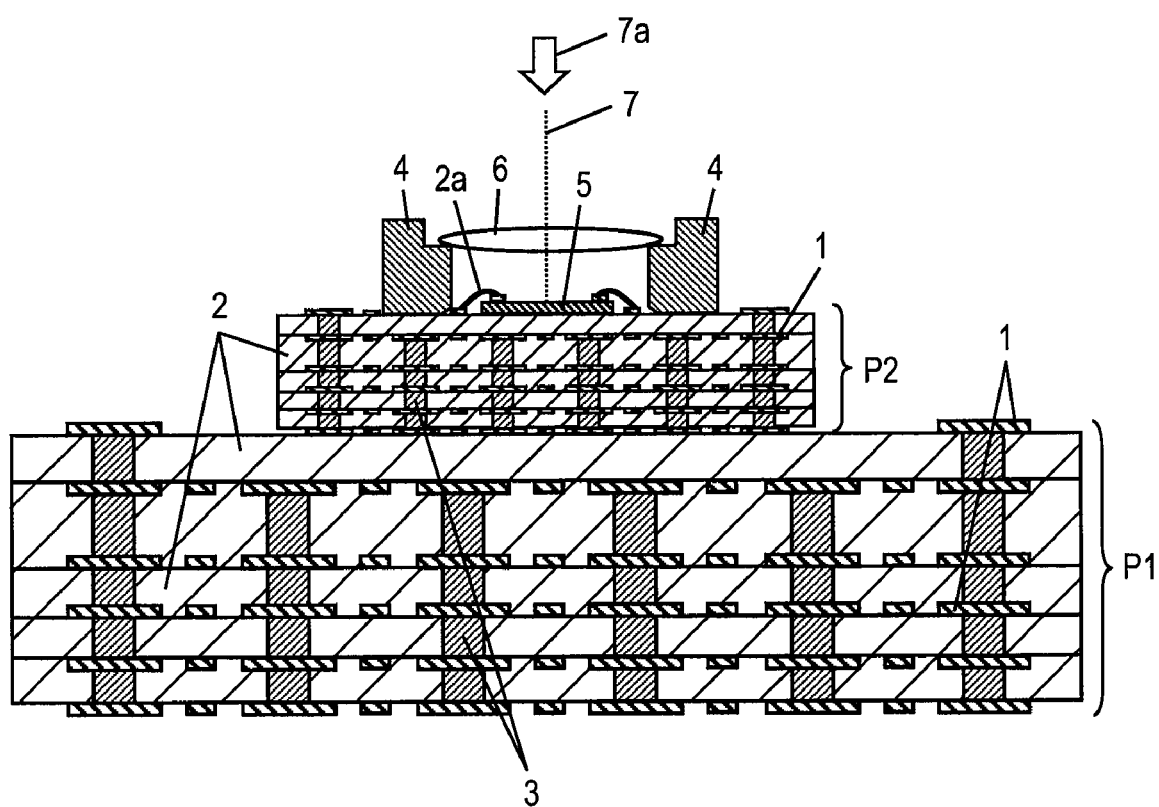
FIG. 11 is a sectional view of a mounting body using conventional multilayer printed wiring boards.

FIGS. 10A and 10B are sectional views of an optical module, which is a mounting body using a multilayer printed wiring board according to a third exemplary embodiment of the present invention. In FIG. 10A, mounting body 16 as an optical module includes optical components, which are accurately positioned and mounted on the top surface of multilayer printed wiring board 11 according to the present invention shown in FIGS. 2A and 2B. The optical components include lens 19 fixed to holder 17. Lens 19 has optical axis 20. Other unillustrated optical components include a light-emitting device such as a semiconductor laser and a light-receiving semiconductor device. In the present exemplary embodiment, the components mounted on multilayer printed wiring board 11 include holder 17, lens 19, the light-emitting device, and the light-receiving semiconductor device. In multilayer printed wiring board 11, printed wiring boards 21a and 21b are stacked with relaxing connection layer 15 disposed therebetween and are connected to each other as shown in FIGS. 2A and 2B. Relaxing connection layer 15 prevents warpage of multilayer printed wiring board 11 in heating and cooling processes. As a result, optical axis 20 is not shifted when, for example, the semiconductor laser is soldered after lens 19 is mounted. This can reduce the adjustment man-hours of the optical module and the product cost. Wring 12 inside and on both sides of multilayer printed wiring board 21b is interconnected through vias 13.

FIG. 10B, on the other hand, shows a mounting body using multilayer printed wiring board 21c, which is composed exclusively of insulating layers 14 and does not include a relaxing connection layer. As shown in FIG. 10B, in printed wiring board 21c not including relaxing connection layer 15, warpage occurs in heating and cooling processes such as soldering, thereby causing optical axis 20 to be shifted. This increases variations in the quality of the optical modules, thereby increasing the adjustment man-hours.

Examples of the optical module include, besides the optical module of the present exemplary embodiment, a combined unit of optical cables and circuit components, and an optical-electronic module including a light guide path, an LED, or a semiconductor laser formed on the surface of a multilayer printed wiring board. The present invention, however, is not limited to them.

Besides the above-described POP or optical module in which a plurality of multilayer printed wiring boards are connected to each other, the present invention can also be applied to a camera module for a mobile phone having a high-definition resolution of 2 million pixels or more. In other words, the present invention can be applied to any components that can be mounted on the multilayer printed wiring board of the present invention.

As described hereinbefore, according to the present invention, wiring on one side of a printed wiring board is embedded in the relaxing connection layer containing a reliever which relieves the internal stress caused by heating and cooling. As a result, the printed wiring board is prevented from warpage or undulation due to its thermal expansion. Thus, the multilayer printed wiring board is prevented from warpage and undulation.

INDUSTRIAL APPLICABILITY

The present invention is useful as a mounting body for a device requiring high accuracy, such as a POP, a camera module, or an optical module because of its low warpage.

The invention claimed is:
1. A multilayer printed wiring board comprising:
a plurality of printed wiring boards each having wiring on both sides thereof;
a relaxing connection layer for interconnecting the printed wiring boards, the relaxing connection layer containing an inorganic filler, a thermosetting resin, a reliever for relieving internal stress and a core material of not more than 5 wt %; and
a via formed in the relaxing connection layer, the via being filled with a conductive paste, wherein the core material includes woven or nonwoven cloth.
2. The multilayer printed wiring board of claim 1, wherein the relaxing connection layer has a thickness of 30 to 300 μm.
3. The multilayer printed wiring board of claim 1, wherein the reliever is a thermoplastic resin.
4. The multilayer printed wiring board of claim 1, wherein the reliever is an elastomer or a rubber.
5. The multilayer printed wiring board of claim 1, wherein the reliever is a polybutadiene- or butadiene-based random copolymer rubber, or a copolymer containing hard and soft segments.
6. The multilayer printed wiring board of claim 1, wherein the inorganic filler is made of at least one of silica, alumina, and barium titanate.
7. The multilayer printed wiring board of claim 1, wherein the relaxing connection layer has an inorganic filler content of 70 to 90 wt %.
8. The multilayer printed wiring board of claim 4, wherein the elastomer is an acrylic elastomer or a thermoplastic elastomer; and the relaxing connection layer has an elastomer content of 0.2 to 5.0 wt %.

9. The multilayer printed wiring board of claim 1, wherein the inorganic filler has a particle size of 0.1 to 15 μm.

10. The multilayer printed wiring board of claim 1, wherein the relaxing connection layer is composed exclusively of the inorganic filler, the thermosetting resin, the reliever and the via.

11. The multilayer printed wiring board of claim 1, wherein the relaxing connection layer contains a coloring agent.

12. The multilayer printed wiring board of claim 1, wherein the relaxing connection layer has a glass transition point of not lower than 185° C.

13. The multilayer printed wiring board of claim 1, wherein the relaxing connection layer has a glass transition point of higher by 10° C. or more than that of the printed wiring boards.

14. The multilayer printed wiring board of claim 1, wherein a lowest melt viscosity of the relaxing connection layer is 1000 to 100000 Pa·s.

15. The multilayer printed wiring board of claim 1, wherein a coefficient of thermal expansion of the relaxing connection layer is lower than that of the printed wiring boards.

16. A mounting body comprising:
a multilayer printed wiring board including:
   a plurality of printed wiring boards each having wiring on both sides thereof; and
   a relaxing connection layer for interconnecting the printed wiring boards, the relaxing connection layer containing an inorganic filler, a thermosetting resin, a reliever for relieving internal stress and a core material of not more than 5 wt %; and
a component mounted on a surface of the multilayer printed wiring board,
wherein the core material includes woven or nonwoven cloth.

* * * * *